United States Patent

Tsubouchi et al.

Patent Number: 5,911,456
Date of Patent: Jun. 15, 1999

[54] METHOD AND APPARATUS FOR MOUNTING PARTS WITH PICK-UP MISTAKE DETECTION AND STORAGE OF MISTAKE RATE

[75] Inventors: Yuzo Tsubouchi, Onojo; Nobutaka Abe, Dazaifu; Yuji Nakamura, Kurume, all of Japan

[73] Assignee: Matsushita Electric Industrial Co., Ltd., Osaka, Japan

[21] Appl. No.: 08/925,746

[22] Filed: Sep. 9, 1997

[30] Foreign Application Priority Data

Sep. 27, 1996 [JP] Japan .................................. 8-256166

[51] Int. Cl.⁶ .............................. H05K 3/30; B23P 11/00; B23P 21/00
[52] U.S. Cl. ...................... 29/833; 29/401.01; 29/407.04; 29/714; 29/721; 29/743; 29/759; 29/832; 29/834
[58] Field of Search ............................. 29/740, 741, 742, 29/743, 832, 834, 836, 759

[56] References Cited

U.S. PATENT DOCUMENTS 5,491,888  2/1996  Sakurai et al. ........................ 29/759 X

FOREIGN PATENT DOCUMENTS 370920  11/1986  Japan .

OTHER PUBLICATIONS

A Partal English Translation of JP-3-70920.

Primary Examiner—S. Thomas Hughes
Assistant Examiner—Rick Kiltae Chang
Attorney, Agent, or Firm—Stevens, Davis, Miller & Mosher, LLP

[57] ABSTRACT

There is disclosed an electronic parts mounting method in which it is possible to avoid a pick-up mistake for electronic parts (chips) in simultaneously picking up the chips respectively stored in juxtaposed parts feeders by a plurality of nozzles provided to a transfer head. Nozzle position data of first, second and third nozzles 9a, 9b and 9c are beforehand obtained by a first camera, and pick-up positions of the chips in parts feeders 4 are obtained by a second camera. After picking up respectively the chips in the parts feeders 4 by the nozzles 9a to 9c it is judged whether or not there would be caused the pick-up mistake. When it is judged there is caused no pick-up mistake, a transfer head is moved to a position above a board and each of the chips is mounted to the board. When it is judged there is caused any pick-up mistake, a pick-up mistake rate of any of the parts feeders in which the pick-up mistake occurs, is updated and each of the chips is picked up again by the nozzle which caused the pick-up mistake.

17 Claims, 11 Drawing Sheets

METHOD AND APPARATUS FOR MOUNTING PARTS WITH PICK-UP MISTAKE DETECTION AND STORAGE OF MISTAKE RATE

BACKGROUND OF THE INVENTION

1. Field of the Invention

This invention relates to an electronic parts mounting method in which electronic parts in parts feeders are picked up by a plurality of nozzles which are provided to a transfer head, and then are transferred to and mounted on a board.

2. Related Art

There has been extensively used the type of electronic parts mounting apparatus for transferring and mounting electronic parts (hereinafter referred to as "chips") on a board, in which while horizontally moving a transfer head in an X-direction and Y-direction by a moving table, a chip, stored in a parts feeder, is held by suction by a lower end of a nozzle on the transfer head, and is picked up, and is transferred and mounted at a predetermined coordinate position on the board.

There has been proposed another electronic parts mounting apparatus of this type (Japanese Patent Examined Publication No. 3-70920) in which chips, stored respectively in a plurality of parts feeders juxtaposed at a pitch, are simultaneously picked up by suction respectively by a plurality of nozzles mounted in a row at a pitch on a transfer head (This operation will be referred to as "simultaneous picking-up" in the present specification), and are transferred to and mounted on a board. This method has an advantage that the mounting efficiency is greatly enhanced since the plurality of electronic parts are simultaneously picked up at a time by the plurality of nozzles.

However, in the electronic parts mounting apparatus of the type in which the chips in the plurality of parts feeders are simultaneously picked up by the plurality of nozzles, the rate of chip pick-up mistake is higher as compared with the type of electronic parts mounting apparatus for picking up a chip in one parts feeder by one nozzle. The cause for this is mainly due to the following reasons.

In this kind of electronic parts mounting apparatus, the pitch of the plurality of nozzles is set to an integral multiple of the pitch between the parts feeders so that the chips in the plurality of parts feeders can be simultaneously picked up by the plurality of nozzles. However, because of various errors (including an error in the mounting of the nozzles on the transfer head, an error in the assembling of the parts feeders, and an error in the juxtaposition of the parts feeders), the pitch of the nozzles fails to be accurately an integral multiple of the pitch between the parts feeder (more correctly, the pitch of the chip pick-up positions between the parts feeders), and thus a slight pitch error is inevitable. Because of this pitch error, all of the plurality of nozzles could not simultaneously pick up the chips in the parts feeders, so that a pick-up mistake was liable to occur.

SUMMARY OF THE INVENTION

It is therefore an object of the present invention to provide an electronic parts mounting method in which parts feeders are juxtaposed at a pitch, and at least not less than three nozzles are mounted on a transfer head at a pitch which is an integral multiple of the pitch of said parts feeders, and while horizontally moving said transfer head by a moving table, electronic parts stored respectively in a plurality of said parts feeders are picked up respectively by said nozzles, and are transferred to and mounted on a board positioned at a positioning portion, wherein after the electronic parts stored respectively in the parts feeders are picked up respectively by simultaneously moving a plurality of said nozzles vertically, it is judged about all of the nozzles whether or not there would be caused a pick-up mistake with means for detecting the pick-up mistake, when it is judged that there exists no nozzle which caused a pick-up mistake, the transfer head is moved to a position above a board and each of the electronic parts is mounted on the board, and when it is judged that there exists any nozzle which caused a pick-up mistake, each of the nozzles which caused the pick-up mistake is moved to a pick-up position above corresponding one of the parts feeders and picks up the electronic parts stored respectively in the parts feeders while moving vertically, then the transfer head is moved to a position above the board and each of the electronic parts is mounted on the board.

According to the present invention, there is provided an electronic parts mounting apparatus comprising a positioning portion for positioning a board, parts feeders juxtaposed at a pitch, a transfer head having at least not less than three nozzles of which the pitch is an integral multiple of the pitch of said parts feeders, and a moving table for moving said transfer head horizontally, wherein electronic parts stored respectively in a plurality of the parts feeders are picked up respectively by said nozzles and each of the electronic parts is mounted on the board, the apparatus comprising:

(a) means for detecting a pick-up mistake, in which after the electronic parts stored respectively in the parts feeders are picked up respectively by simultaneously moving a plurality of the nozzles vertically, it is judged about all of the nozzles whether or not there would be caused the pick-up mistake, and (b) a control portion for detecting the pick-up mistake by said means, whereby, when it is judged that there exists no nozzle which caused a pick-up mistake, the transfer head is moved to a position above the board for mounting each of the electronic parts on the board, when it is judged that there exists any nozzle which caused a pick-up mistake, the nozzle which caused the pick-up mistake is moved to a pick-up position above corresponding one of the parts feeders and is moved vertically, and then the transfer head is moved to a position above the board for mounting each of the electronic parts on the board.

DESCRIPTION OF THE PREFERRED EMBODIMENTS

Figure 1:
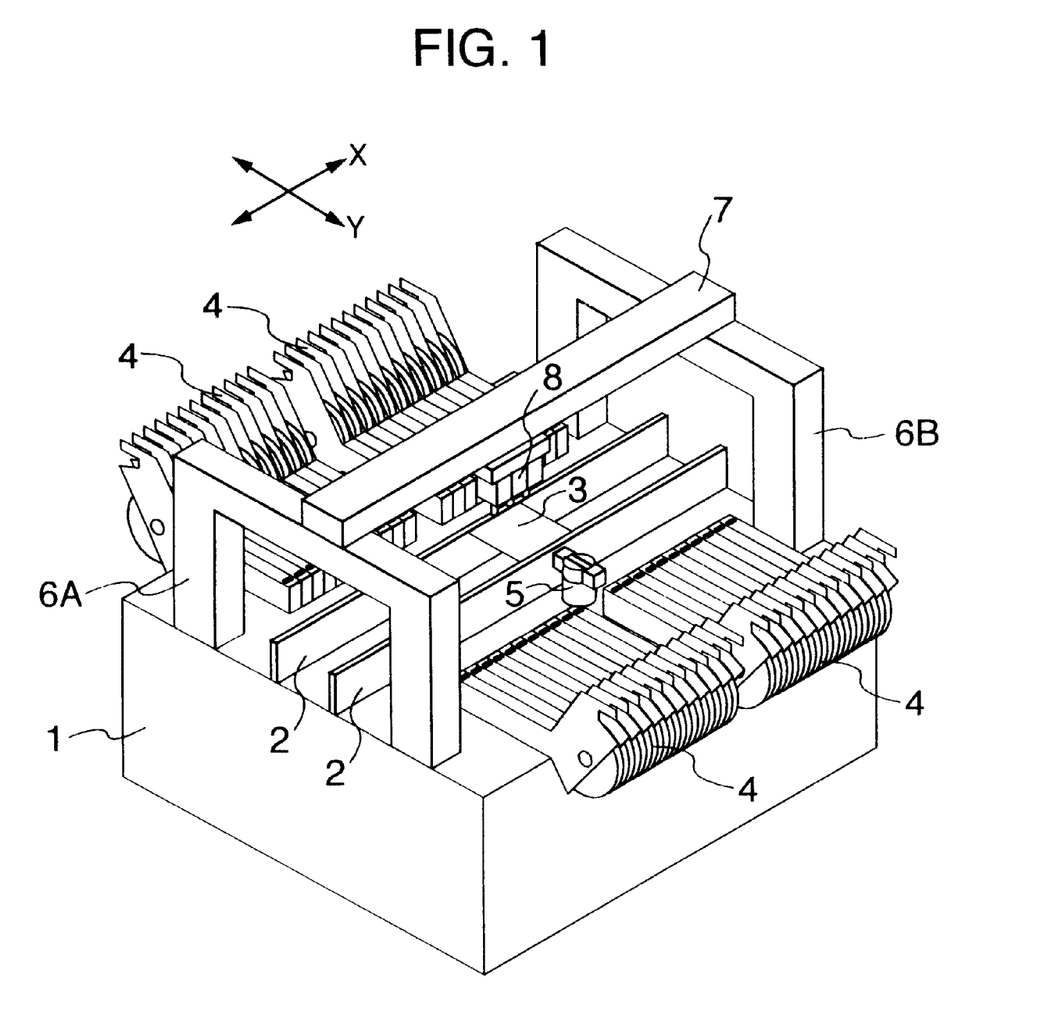
FIG. 1 is a perspective view of an one embodiment of an electronic parts mounting apparatus in accordance with the present invention.
Figure 2:
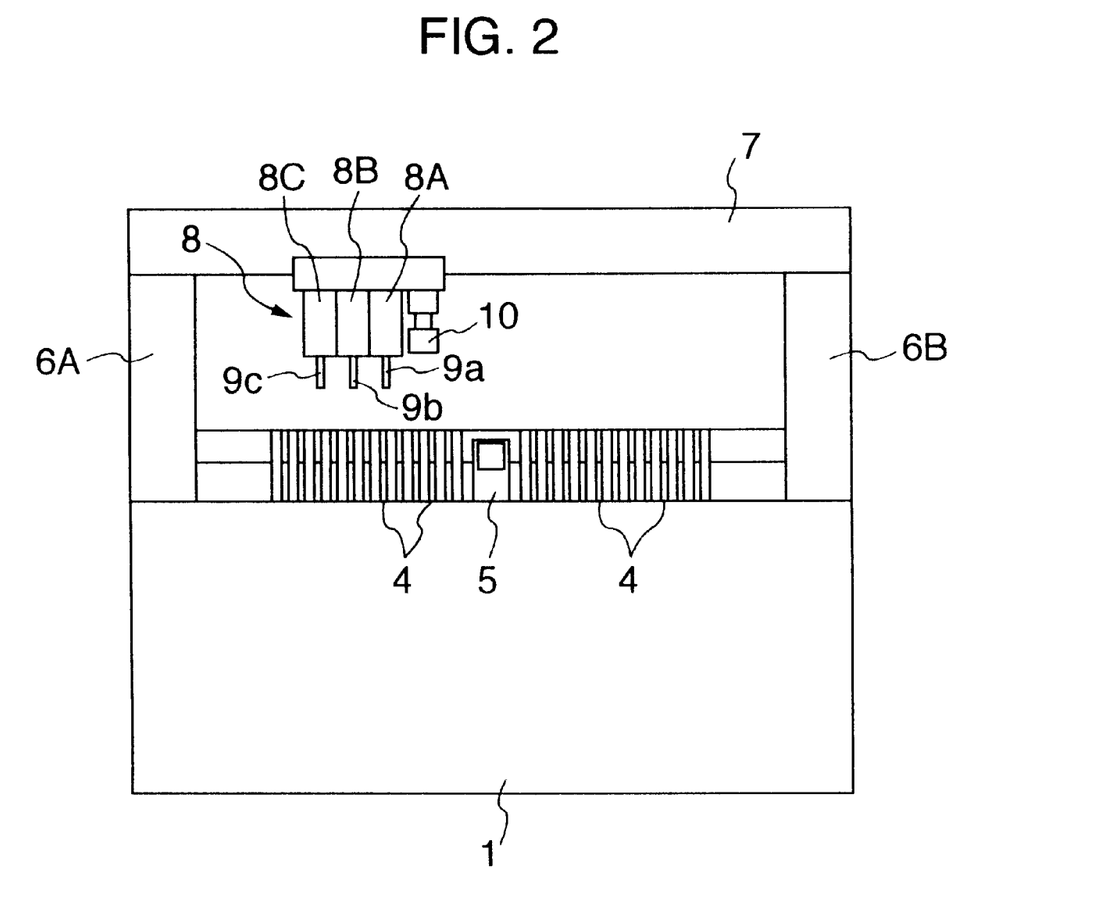
FIG. 2 is a front-elevational view of the one embodiment of the electronic parts mounting apparatus in accordance with the present invention.

Referring to FIGS. 1 and 2, the overall construction of the electronic parts mounting apparatus will first be described. Two guide rails 2 are mounted on an intermediate portion of an upper surface of a bed 1. A board 3 is conveyed along the guide rails 2, and is positioned at a predetermined position by the guide rails 2. Namely, the guide rails 2 serve as a positioning portion for positioning the board 3. A number of parts feeders 4 are juxtaposed in a row on the outer side of each of the guide rails 2. Various kinds of chips (electronic parts) are stored in the parts feeders 4. A first camera 5 is provided between the guide rail 2 and the parts feeders 4. As described later, the first camera 5 observes nozzles on a transfer head so as to detect the positions of these nozzles, and also detects the positions of the chips held by suction respectively by the nozzles.

In FIG. 2, Y-tables 6A and 6B are mounted respectively on opposite side portions of the bed 1, and an X-table 7 is laid over the Y-tables 6A and 6B. The transfer head 8 is mounted on the X-table 7. The transfer head 8 comprises a plurality of (three in this embodiment) heads (a first head 8A, a second head 8B and a third head 8C) juxtaposed in a row, and the three heads have the first nozzle 9a, the second nozzle 9b and the third nozzle 9c, respectively. A second camera 10 is fixedly mounted on the transfer head 8. The Y-tables 6A and 6B and the X-table 7 serve as tables for horizontally moving the transfer head 8 in an X-direction and a Y-direction. As described later, the second camera 10 horizontally moves in unison with the transfer head 8, and observes the chips stored in the parts feeders 4, and detects pick-up positions for the chips and the position of the board 3. In the present invention, the direction of conveyance of the board 3 along the guide rails 2 is the X-direction.

Figure 3:
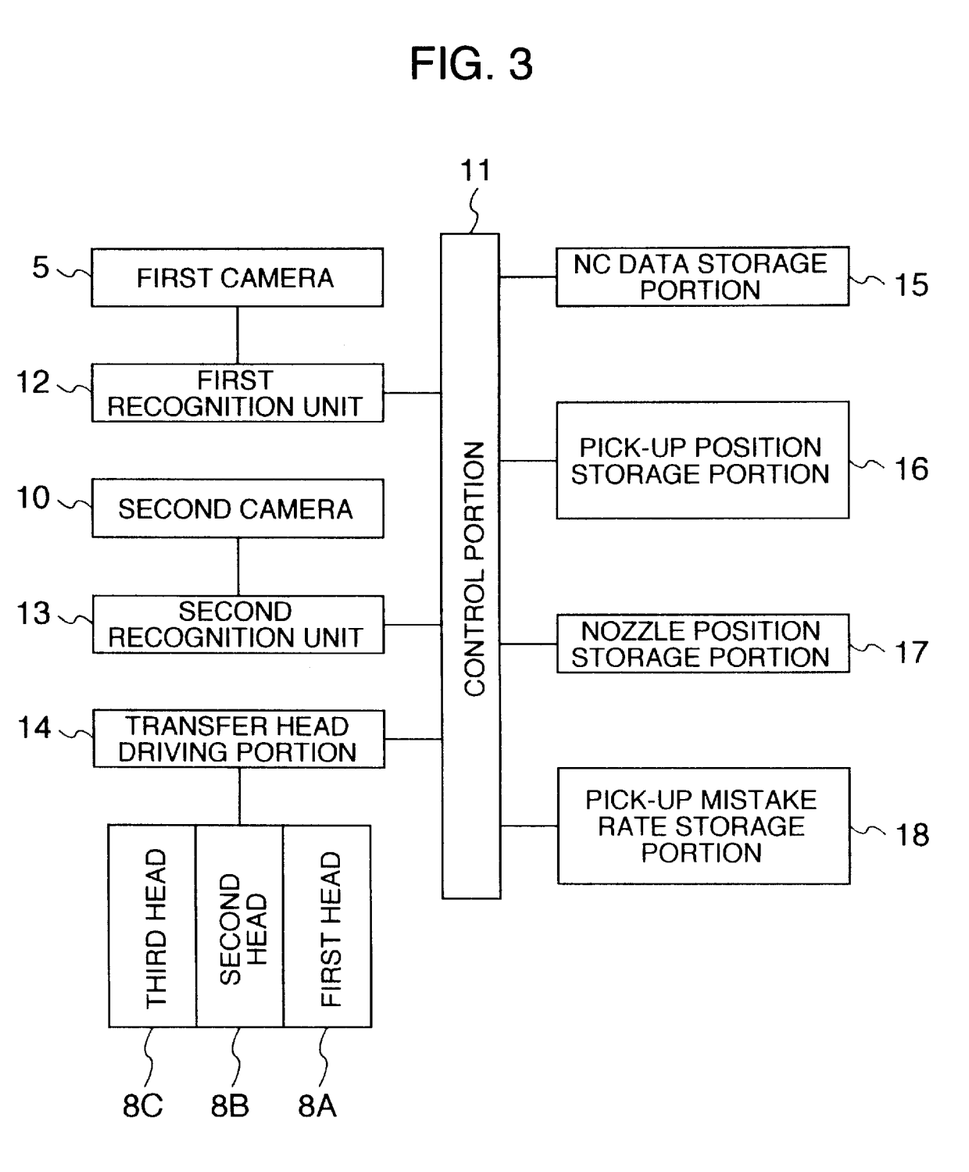
FIG. 3 is a block diagram of a control system of the embodiment of the electronic parts mounting apparatus in accordance with the present invention.

In FIG. 3, reference numeral 11 denotes a control portion, and the following elements are connected to this control portion 11. A first recognition unit 12 is connected to the first camera 5. The first recognition unit 12 processes image data of the nozzles and the chips taken by the first camera 5. In accordance with these data, the control portion 11 finds the positions of the nozzles and chips through calculation or computation. A second recognition unit 13 is connected to the second camera 10. The second recognition unit 13 processes image data of a position mark of the board and image data of the chips at the pick-up positions of the parts feeders 4, which data are taken by the second camera 10. In accordance with these data, the control portion 11 finds the position of the board 3 and the pick-up positions through calculation. A transfer head driving portion 14 is connected to the first head 8A, the second head 8B and the third head 8C. The transfer head driving portion 14 moves the first nozzle 9a, the second nozzle 9b and the third nozzle 9c upward and downward.

Program data, including data related to the order of mounting of the chips and the positions of mounting of the chips, are stored in a NC data storage portion 15. A pick-up position storage portion 16 stores the positions of picking-up of the chips in the parts feeders 4. A nozzle position storage portion 17 stores the positions of the first, second and third nozzles 9a, 9b and 9c detected by the first camera 5. The control portion 11 effects various calculations and judgments, and controls the various elements.

This electronic parts mounting apparatus has the above construction, and the operation thereof will now be described.

First, in FIG. 1, the transfer head 8 is moved to a position above the first camera 5, and observes the three nozzles 9a, to 9c to detect the positions of these nozzles 9a, to 9c. Data of the detected positions of the nozzles 9a, to 9c are stored in the nozzle position storage portion 17 (FIG. 3).

Then, the second camera 10 is moved to be disposed above each of the parts feeders 4, and observes the chip at a foremost position (pick-up position) of each parts feeder 4, thereby detecting the chip pick-up position of each parts feeder 4. Incidentally, each of the parts feeders 4 includes a tape for storing the electronic parts (chips) as disclosed in Japanese Patent Unexamined Publication No. 5-75294, and the chips are stored respectively in pockets of this tape. The tape is fed a predetermined pitch by a pitch feed means such as a sprocket, and each of the nozzles on the transfer head is moved vertically, and the foremost (leading) chip is held by suction by the lower end of the nozzle, and is picked up.

In the present invention, before the chips in the parts feeders 4 are picked up respectively by the nozzles 9a to 9c of the transfer head 8, the foremost chips in all of the parts feeders 4 are observed by the second camera 10, thereby detecting the chip pick-up positions. Data of the detected pick-up positions are stored in the pick-up position storage portion 16 (FIG. 3). The above-mentioned steps are effected before the mounting of the chips is carried out, and also when the pick-up conditions are changed (for example, when the parts feeders 4 are exchanged, when the arrangement of the parts feeders 4 is changed, or when the nozzles 9a to 9c are exchanged).

Figure 4:
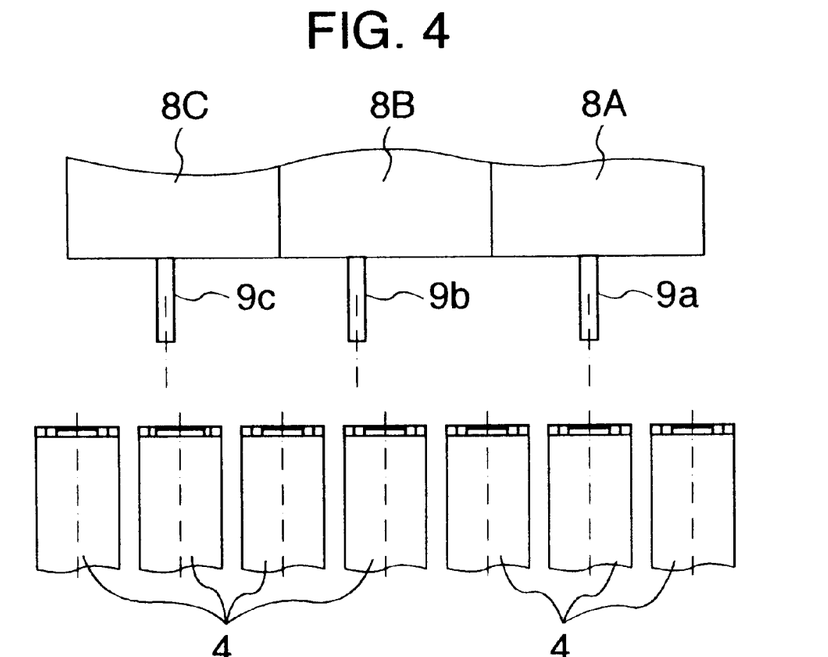
FIG. 4 is a front-elevational view showing a pick-up operation of the nozzles of the one embodiment of the electronic parts mounting apparatus in accordance with the present invention.
Figure 5:
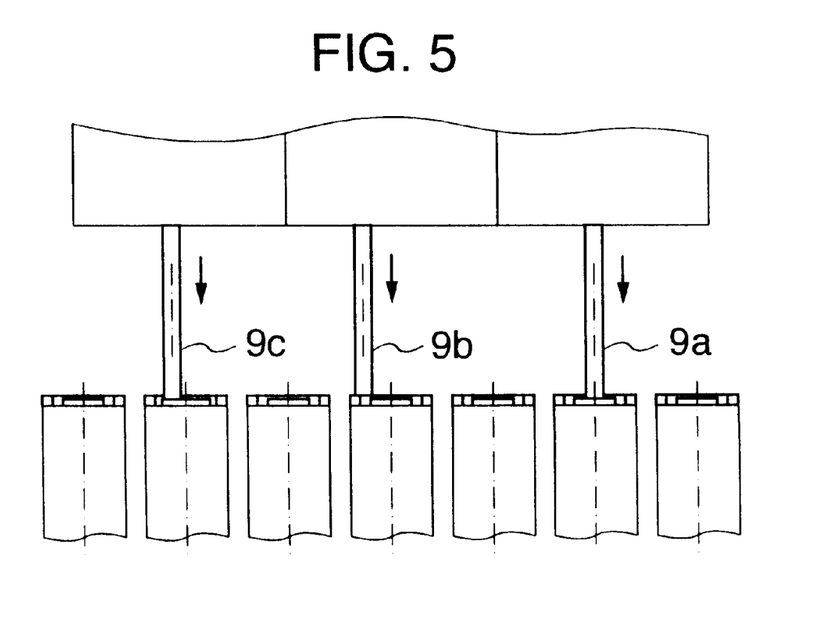
FIG. 5 is a front-elevational views showing the pick-up operation of the nozzles of the one embodiment of the electronic parts mounting apparatus in accordance with the present invention.
Figure 6:
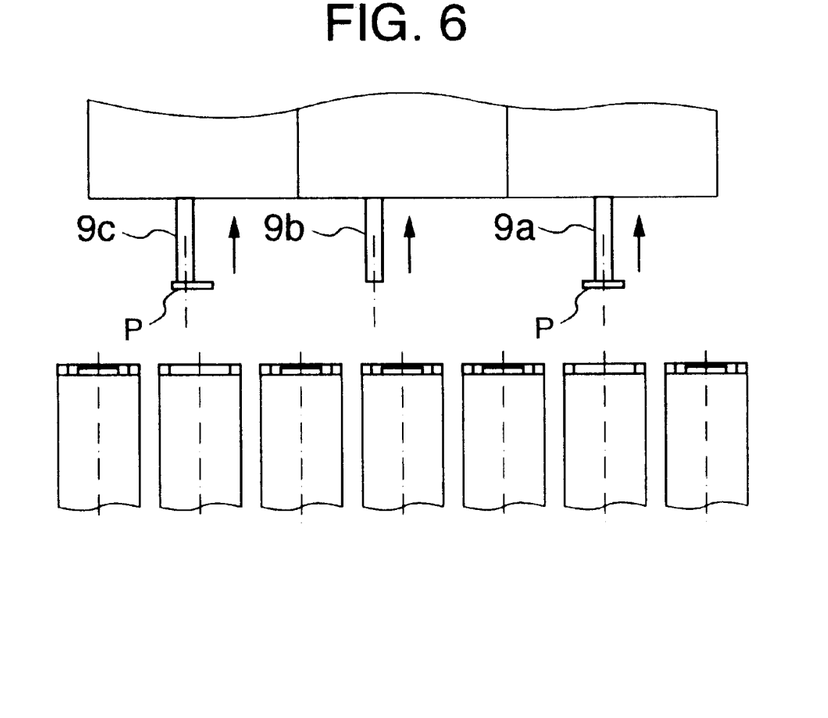
FIG. 6 is a front-elevational views showing the pick-up operation of the nozzles of the one embodiment of the electronic parts mounting apparatus in accordance with the present invention.
Figure 16:
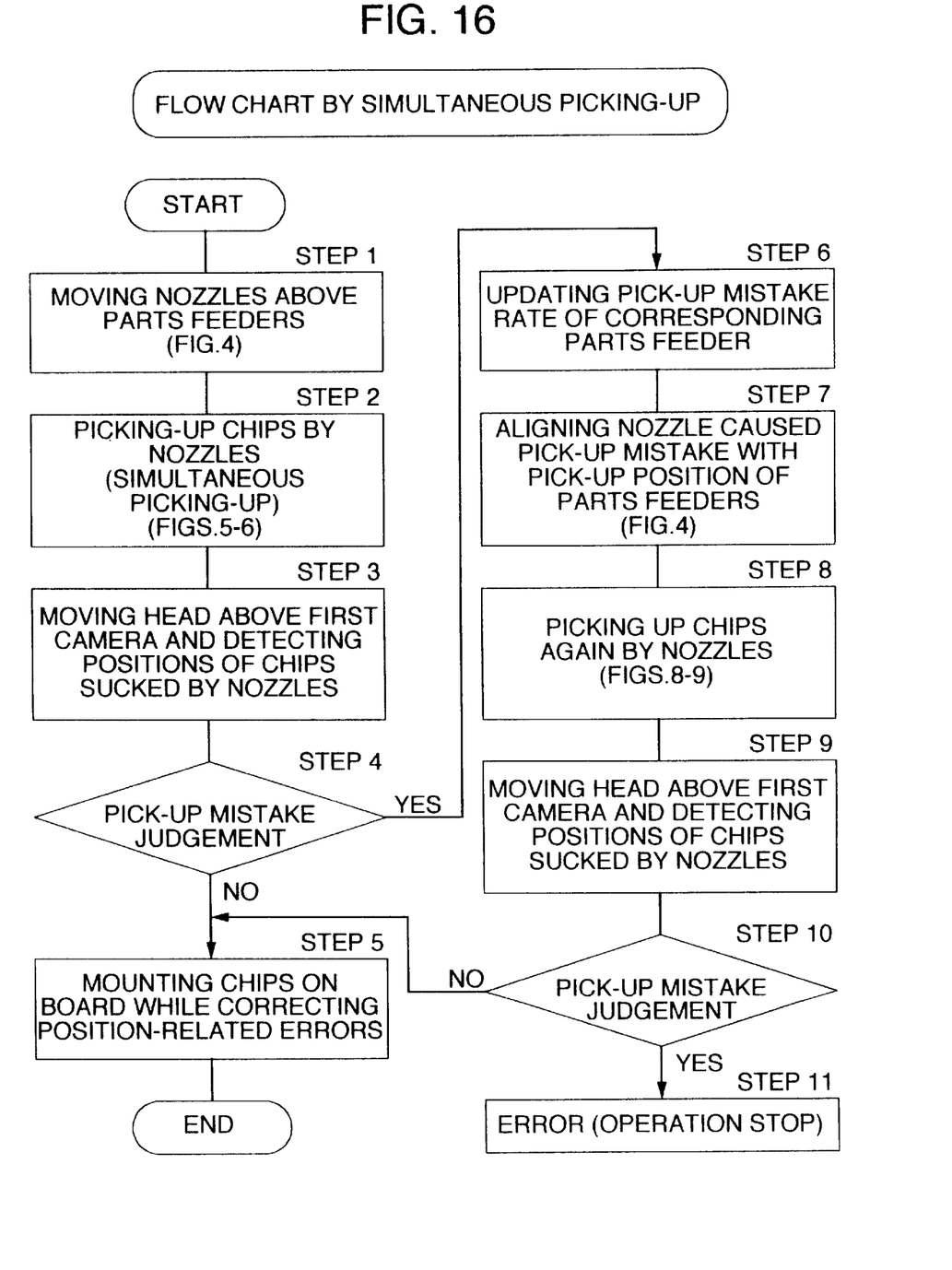
FIG. 16 is a flow chart of amounting operation for chips in the one embodiment of the electronic parts mounting apparatus in accordance with the present invention.
Figure 17:
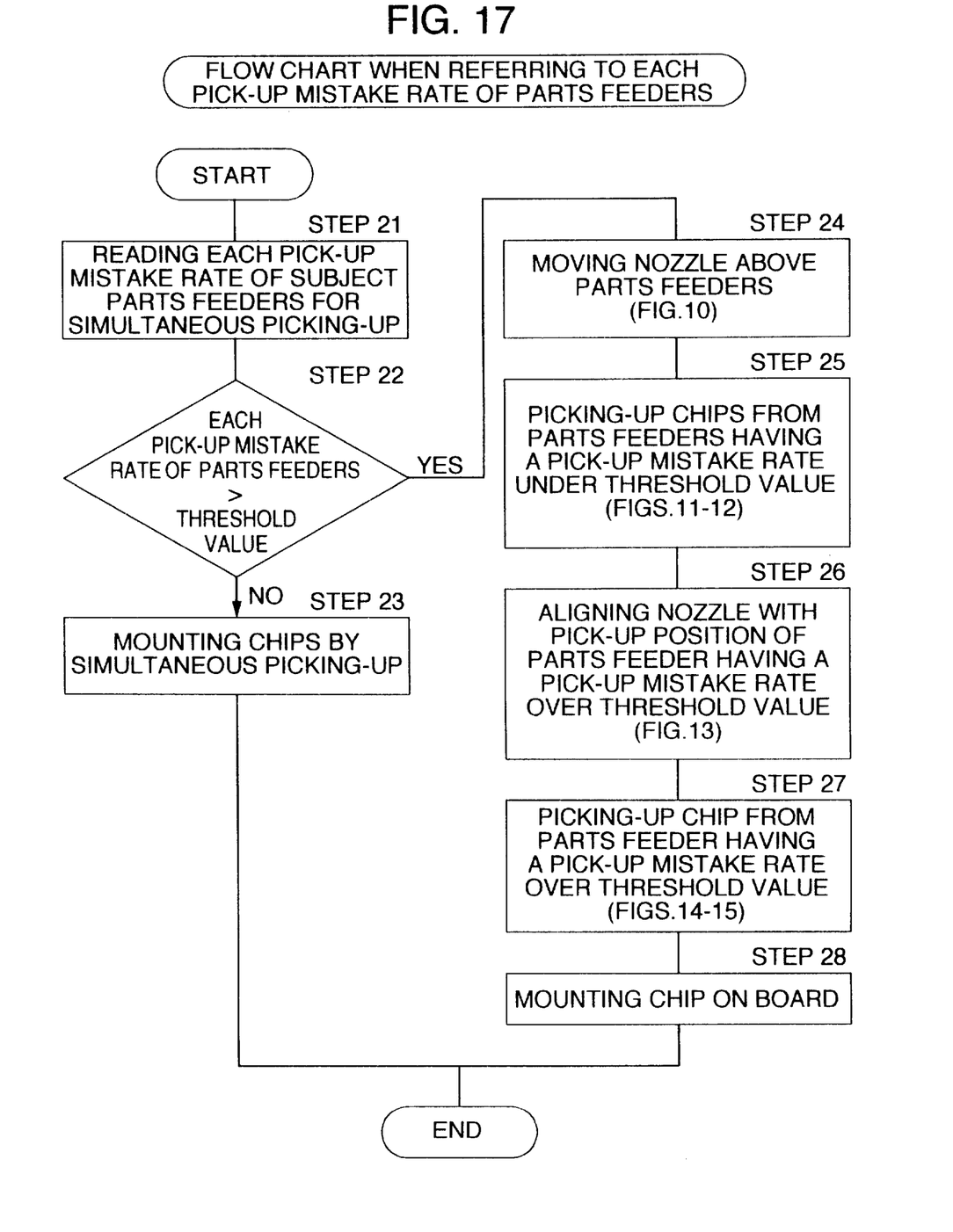
FIG. 17 is a flow chart of a mounting operation for chips in the one embodiment of the electronic parts mounting apparatus in accordance with the present invention.

When the above-mentioned steps are finished, the processing or program proceeds to the following operations. FIGS. 4–15 show a vertical motion of the nozzles 9a to 9c when the chips are simultaneously picked up respectively by a plurality of the nozzles. FIG. 16 shows a flow chart of a pick-up operation for the chips. As shown in FIG. 4, a plurality of the nozzles 9a to 9c are moved above the parts feeders 4 (Step 1). The position of the first nozzle 9a is accurately aligned with the pick-up position of corresponding one of the parts feeders 4; however, the second nozzle 9b and the third nozzle 9c are deviated from the respective pick-up positions of the parts feeders 4 due to various kinds of errors. As shown in FIGS. 5–6, chips P are simultaneously picked up respectively by a plurality of the nozzles 9a to 9c (simultaneous picking-up) (Step 2). Since the position of the second nozzle 9b is considerably deviated relative to the original pick-up position thereof, there would be caused a chip pick-up mistake. The transfer head 8 is moved above the first camera 5; the position of each of the chips held by suction by the nozzles 9a to 9c is detected (Step 3). It is judged whether or not there would be caused the chip pick-up mistake (Step 4). If the judgement result is "No", each of the chips is mounted to the board 3 while correcting position-related errors of each of the chips (Step 5). As a method of detecting whether or not there would be caused the pick-up mistake, for an example, the method of measuring the vacuum pressure of the nozzles 9a to 9c can be used. Among the errors associated with the chips, a position-related error toward an X-axis direction or a Y-axis direction is corrected by readjusting the moving stroke, which is brought about by driving the X-table 7 or the Y-tables 6A and 6B, of the transfer head 8 toward the X-axis or Y-axis, and an azimuth-related error toward a θ direction (horizontal rotating direction) is corrected by rotating each of the nozzles 9a to 9c which hold the chips by vacuum suction around a center axis thereof.

Figure 7:
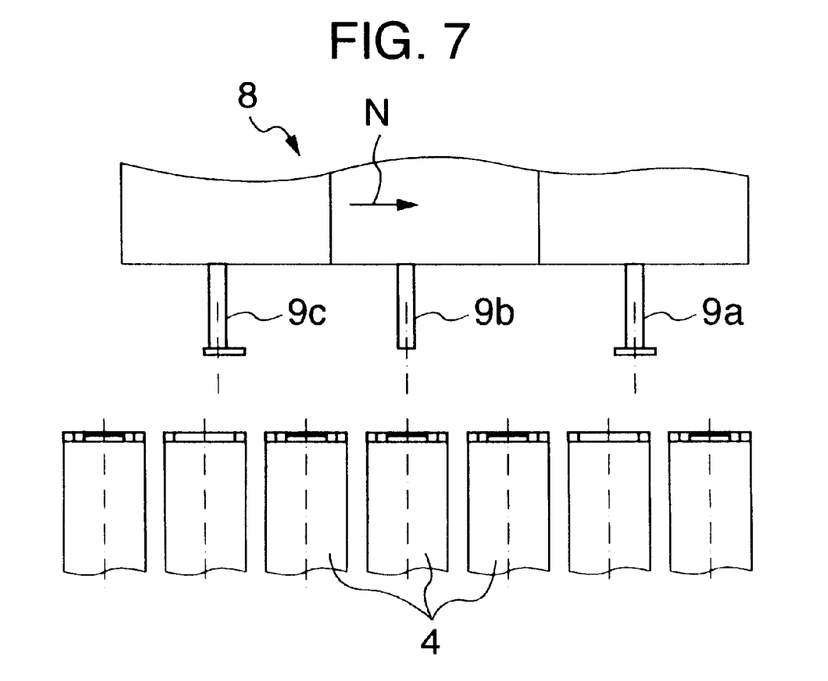
FIG. 7 is a front-elevational views showing the pick-up operation of the nozzles of the one embodiment of the electronic parts mounting apparatus in accordance with the present invention.
Figure 8:
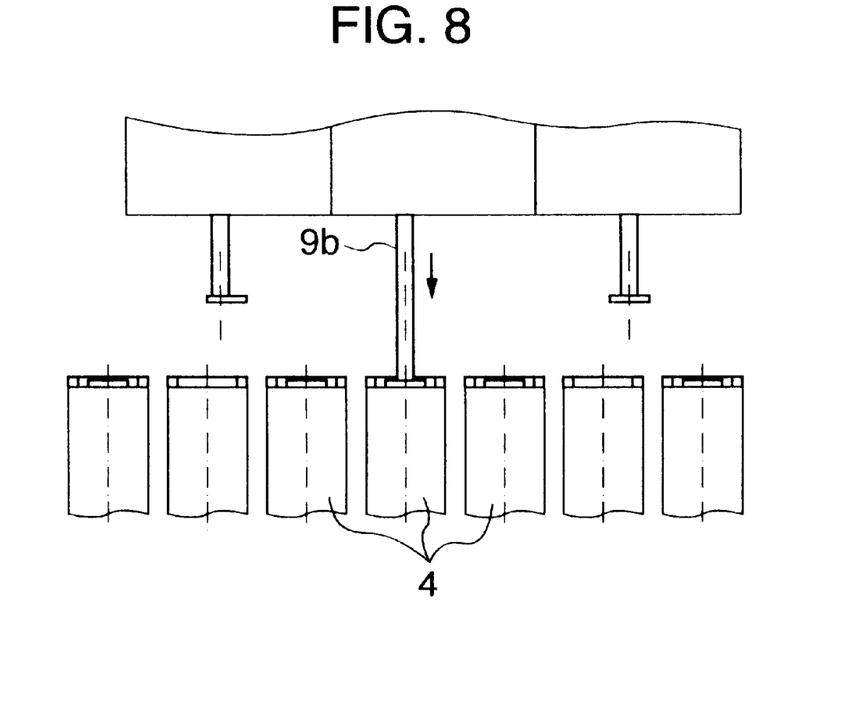
FIG. 8 is a front-elevational view showing the pick-up operation of the nozzles of the one embodiment of the electronic parts mounting apparatus in accordance with the present invention.
Figure 9:
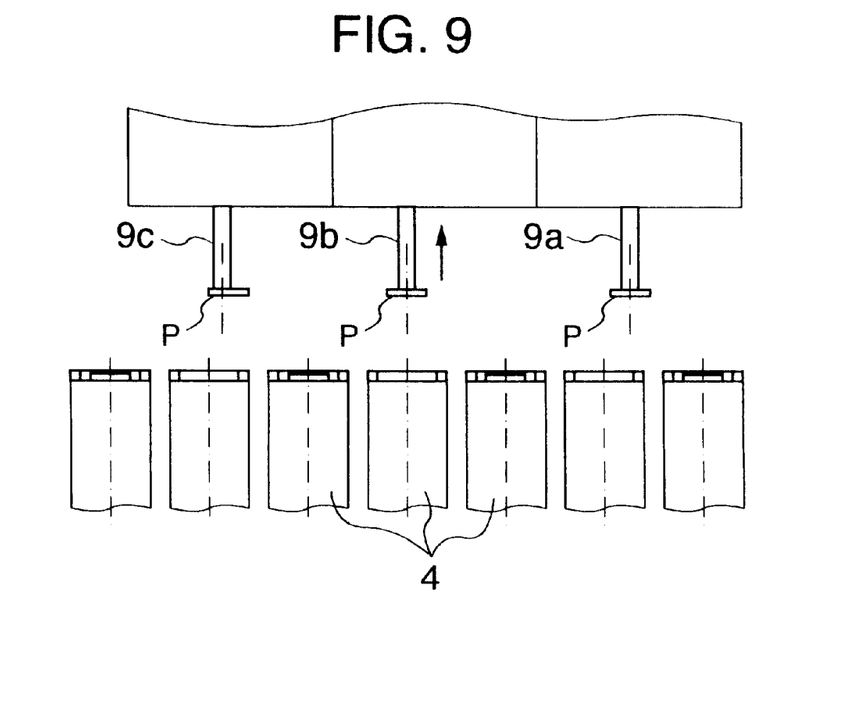
FIG. 9 is a front-elevational view showing the pick-up operation of the nozzles of the one embodiment of the electronic parts mounting apparatus in accordance with the present invention.

If the judgement result is "Yes", a pick-up mistake rate of a corresponding one of the parts feeders 4, in which the pick-up mistake occurs, in a pick-up mistake rate storage portion 18 (FIG. 3) is updated (Step 6). As shown in FIG. 7, by moving the transfer head 8 toward a direction indicated by an arrow N, the nozzle which caused the pick-up mistake (the second nozzle 9b in this embodiment as shown in FIG. 7) is accurately aligned with the pick-up position of corresponding one of the parts feeders 4 (Step 7). As shown in FIGS. 8–9, one of the chips is picked up again by the second nozzle 9b which caused the pick-up mistake (Step 8). In this case, since the second nozzle 9b is accurately aligned with the pick-up position of corresponding one of the parts feeders 4, the probability causing the pick-up mistake is very low. The transfer head 8 is moved to a position above the first camera 5 and the position of each of the chips held by suction by the nozzles 9a to 9c is detected in the same way as Step 3 (Step 9). It is judged whether or not there would be caused the chip pick-up mistake in the same way as Step 4 (Step 10). If the judgement result is "No", then the processing or program branches off and leads to the Step 5. If the judgement result is "Yes", then the operation of the apparatus is stopped (Step 11).

Referring to FIGS. 10–15 and 17, the case in which each pick-up mistake rate of the parts feeders 4 is referred to, will be described below. Each pick-up mistake rate of the parts feeders 4 to be the objects for simultaneous picking-up is read (Step 21). It is judged whether or not there exist any parts feeder of which the pick-up mistake rate is greater than a threshold value (Step 22). If the judgement result is "No", each of the chips is mounted by simultaneous picking-up in the same way as Steps 1–10 in FIG. 16 (Step 23).

Figure 10:
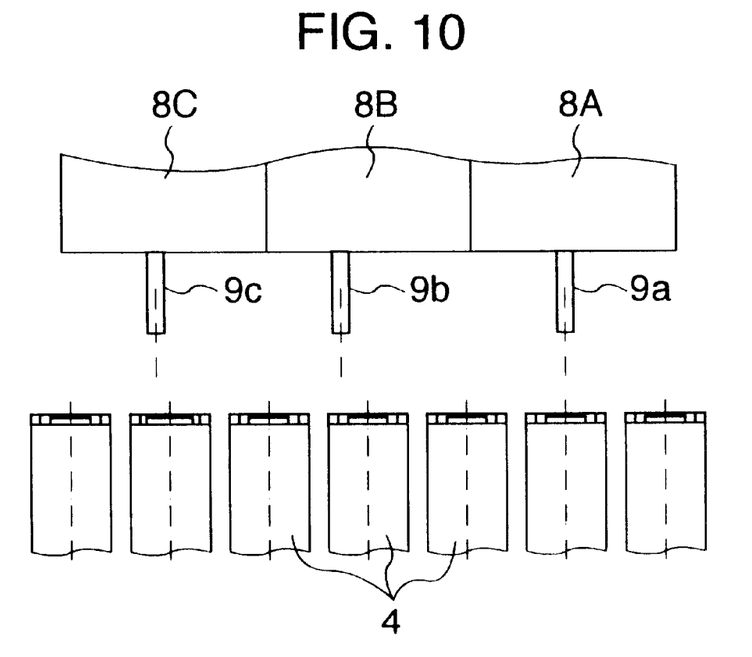
FIG. 10 is a front-elevational view showing the pick-up operation of the nozzles of the one embodiment of the electronic parts mounting apparatus in accordance with the present invention.
Figure 11:
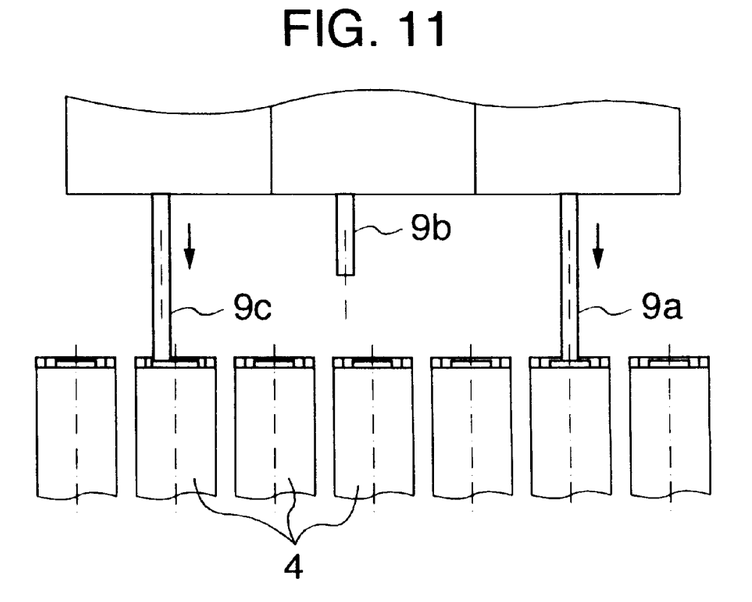
FIG. 11 is a front-elevational view showing the pick-up operation of a nozzles of the one embodiment of the electronic parts mounting apparatus in accordance with the present invention.
Figure 12:
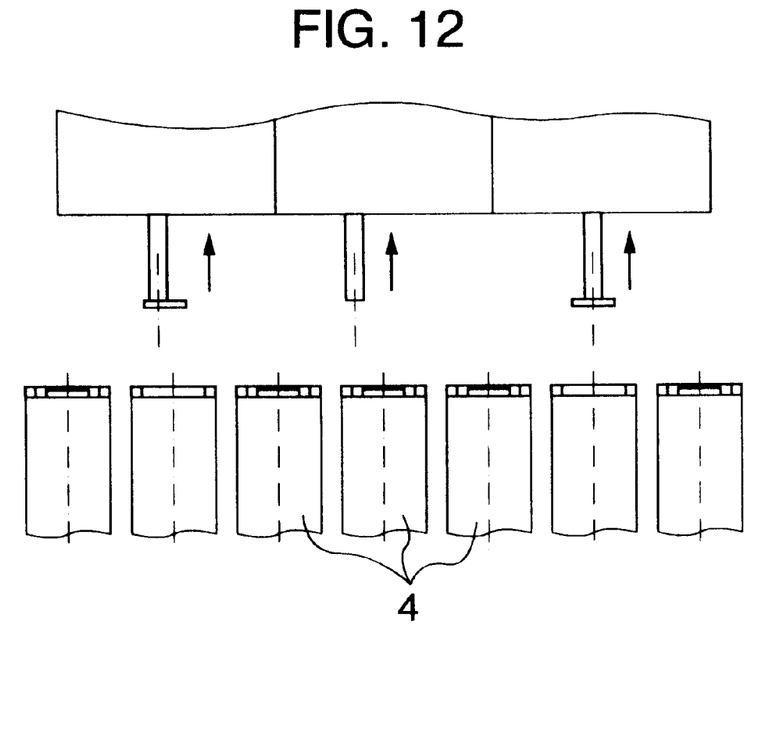
FIG. 12 is a front-elevational view showing the pick-up operation of the nozzles of the one embodiment of the electronic parts mounting apparatus in accordance with the present invention.

If the judgement result is "Yes" in the Step 22, a plurality of the nozzles 9a to 9c are moved above the parts feeders 4 as shown in FIG. 10 (Step 24). As shown in FIGS. 11–12, the chips P are picked up respectively from the parts feeders 4 each of which the pick-up mistake rate is not greater than a threshold value (Step 25). Now in this embodiment, there is assumed that the pick-up mistake rate of the parts feeders 4 corresponding to the second nozzle 9b is greater than a threshold value.

Figure 13:
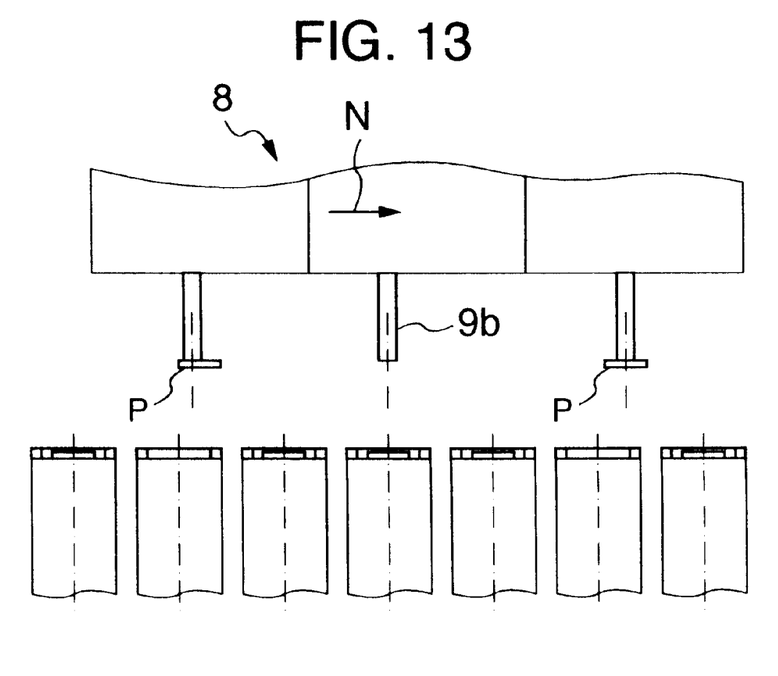
FIG. 13 is a front-elevational view showing the pick-up operation of the nozzles of the embodiment of the electronic parts mounting apparatus in accordance with the present invention.
Figure 14:
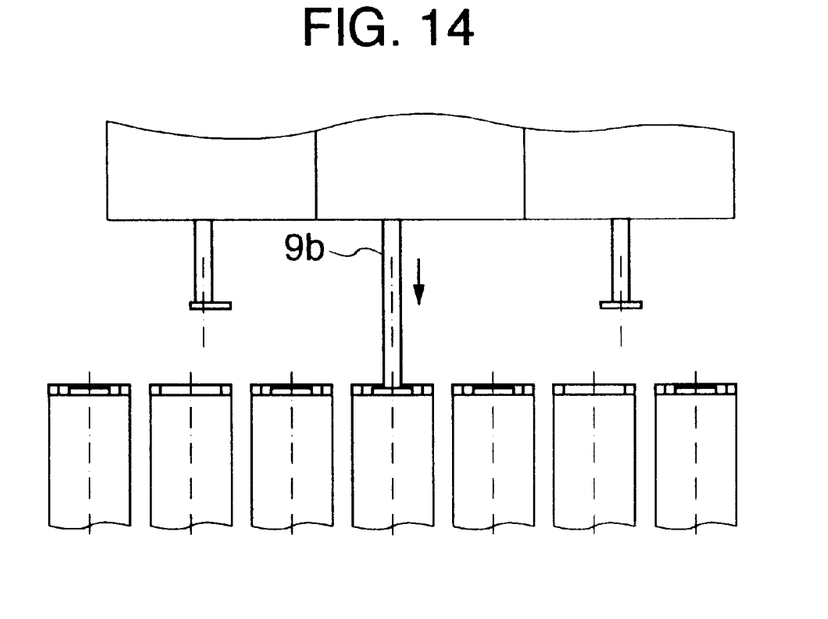
FIG. 14 is a front-elevational view showing the pick-up operation of the nozzles of the one embodiment of the electronic parts mounting apparatus in accordance with the present invention.
Figure 15:
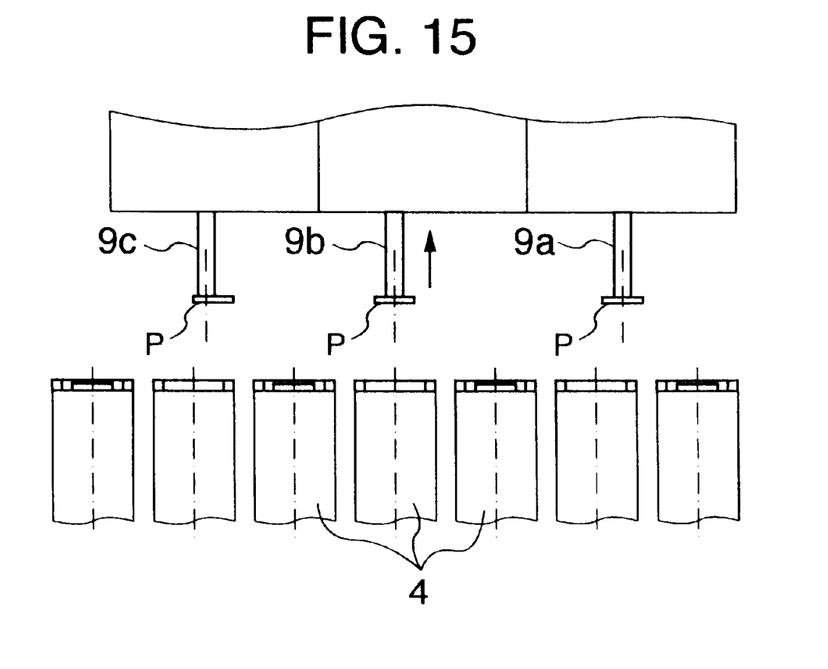
FIG. 15 is a front-elevational view showing the pick-up operation of the nozzles of the one embodiment of the electronic parts mounting apparatus in accordance with the present invention.

As shown in FIG. 13, the transfer head 8 is moved toward a direction indicated by an arrow N. The nozzle (the second nozzle 9b in this embodiment) is aligned with the pick-up position of corresponding one of the parts feeders 4 of which the pick-up mistake rate is greater than a threshold value (Step 26). As shown in FIGS. 14–15, one of the chips P is picked up by the second nozzle 9b from corresponding one of the parts feeders 4 of which the pick-up mistake rate is greater than a threshold value (Step 27). Each of the chips P is mounted on the board (Step 28).

In the electronic parts mounting method of the present invention for simultaneously picking up the chips respectively from the plurality of parts feeders by a plurality of the nozzles, after the electronic parts in the plurality of parts feeders are simultaneously picked up respectively by not less than 3 nozzles, it is judged about all of the nozzles whether or not there would be caused the pick-up mistake, and therefore when it is judged that there exists any nozzle which caused the pick-up mistake, each of the nozzles which caused the pick-up mistake is moved to respective pick-up positions of the parts feeders and then each of the chips is again picked up by the nozzles, so that the pick-up mistake is avoided.

What is claimed is:

1. A parts mounting method in which a plurality of parts feeders are provided, and a plurality of transfer elements are mounted in a line on a transfer head, and while said transfer head is moved by a moving table, parts stored respectively in the plurality of parts feeders are picked up respectively by said plurality of transfer elements, and are transferred to and mounted on a board positioned at a positioning portion, the method comprising:

(a) moving the transfer head for positioning the plurality of transfer elements about the plurality of parts feeders;

(b) simultaneously moving the plurality of transfer elements to the plurality of parts feeders and picking up the parts from the parts feeders with the transfer elements;

(c) judging whether any of the plurality of transfer elements causes a pick-up mistake;

(d) when judged in step (c) that none of the plurality of transfer elements causes the pick-up mistake, moving the transfer head to a position above the board and mounting each of the parts on the board; and (e) when judged in step (c) that any of the transfer elements causes the pick-up mistake, (i) moving the transfer head such that each of the transfer elements which cause the pick-up mistake is brought into alignment with a pick-up position above a corresponding one of the plurality of parts feeders, (ii) then moving again said each of the transfer elements which cause the pick-up mistake to the corresponding one of the plurality of parts feeders and picking up the parts stored respectively in the corresponding one of the plurality of parts feeders and (iii) then moving the transfer head to the position above the board and mounting each of the parts on the board.

2. The parts mounting method as in claim 1, wherein the parts are electronic parts.

3. The parts mounting method as in claim 1, wherein the plurality of transfer elements comprise at least three transfer elements.

4. The parts mounting method as in claim 1, wherein:
the plurality of parts feeders are juxtaposed at a first pitch; and
the plurality of transfer elements are mounted on the transfer head at a second pitch which is an integral multiple of the first pitch.

5. The parts mounting method as in claim 1, wherein step (c) is performed with a camera.

6. A parts mounting method as in claim 1, wherein:
the transfer head moves horizontally; and
the plurality of transfer elements move vertically to the plurality of parts feeders.

7. The parts mounting method as in claim 1, further comprising storing a pick-up mistake rate of each of the plurality of parts feeders.

8. The parts mounting method as in claim 1, wherein each of the transfer elements comprises a nozzle.

9. A parts mounting apparatus comprising:
(a) a positioning portion for positioning a board;
(b) a plurality of parts feeders;
(c) a transfer head having a plurality of transfer elements;
(d) a moving table for moving said transfer head, wherein parts stored respectively in the plurality of parts feeders are picked up respectively by said plurality of transfer elements and each of the parts is mounted on the board;
(e) detecting means for detecting a pick-up mistake, in which after the parts stored respectively in the plurality of parts feeders are picked up respectively by simultaneously moving the plurality of transfer elements, the detecting means detects whether any of the plurality of transfer elements causes the pick-up mistake and provides a detection result, and (f) a control portion for receiving the detection result and for controlling the parts mounting apparatus such that (i) when the detecting means detects that none of the transfer elements causes the pick-up mistake, the transfer head is moved to a position above the board for mounting each of the parts on the board, and (ii) when the detecting means detects that at least one of the plurality of transfer elements causes the pick-up mistake, (A) each of the transfer elements which cause the pick-up mistake is moved to a pick-up position above a corresponding one of the plurality of parts feeders and is moved to the corresponding one of the plurality of parts feeders, and then (B) the transfer head is moved to the position above the board for mounting each of the parts on the board.

10. The parts mounting apparatus as in claim 9, wherein:
the parts are electronic parts; and
the plurality of parts feeders are electronic parts feeders.

11. The parts mounting apparatus as in claim 9, wherein the plurality of transfer elements comprise at least three transfer elements.

12. The parts mounting apparatus as in claim 9, wherein:
the plurality of parts feeders are juxtaposed at a first pitch; and
the plurality of transfer elements are mounted on the transfer head at a second pitch which is an integral multiple of the first pitch.

13. The parts mounting apparatus as in claim 9, wherein the detecting means comprises a camera.

14. The parts mounting apparatus as in claim 9, wherein:
the transfer head moves horizontally; and
the plurality of transfer elements move vertically to the plurality of parts feeders.

15. The parts mounting apparatus as in claim 9, wherein, in operational step (ii)(A) carried out by the control portion, the transfer head is moved such that each of the transfer elements which cause the pick-up mistake is brought into alignment with the pick-up position above the corresponding one of the plurality of parts feeders.

16. The parts mounting apparatus as in claim 9, further comprising a pick-up mistake rate storage portion for storing a pick-up mistake rate of each of the plurality of parts feeders.

17. The parts mounting apparatus as in claim 9, wherein each of the transfer elements comprises a nozzle.

* * * * *